(12) United States Patent
Tsuji et al.

(10) Patent No.: US 7,781,072 B2
(45) Date of Patent: *Aug. 24, 2010

(54) ORGANIC ELECTROLUMINESCENCE DEVICE

(75) Inventors: Taishi Tsuji, Tsurugashima (JP); Hiroshi Miyazaki, Kitakyushu (JP)

(73) Assignees: Pioneer Corporation, Tokyo (JP); Nippon Steel Chemical Co., Ltd., Tokyo (JP)

( * ) Notice: Subject to any disclaimer, the term of this patent is extended or adjusted under 35 U.S.C. 154(b) by 546 days.

This patent is subject to a terminal disclaimer.

(21) Appl. No.: 10/509,390

(22) PCT Filed: Mar. 27, 2003

(86) PCT No.: PCT/JP03/03776

§ 371 (c)(1), (2), (4) Date: Jun. 28, 2005

(87) PCT Pub. No.: WO03/083009

PCT Pub. Date: Oct. 9, 2003

(65) Prior Publication Data

US 2005/0233164 A1 Oct. 20, 2005

(30) Foreign Application Priority Data

Mar. 29, 2002 (JP) .............................. 2002-096908

(51) Int. Cl.
*H01L 51/54* (2006.01)
(52) U.S. Cl. ................. 428/690; 428/917; 313/504; 313/506; 257/E51.043; 257/E51.044
(58) Field of Classification Search ............... 428/690, 428/917; 257/40, 88–103, E51.001–E51.052, 257/301.16–301.35; 313/502–509; 427/58, 427/66; 546/7

See application file for complete search history.

(56) References Cited

U.S. PATENT DOCUMENTS

| 5,141,671 | A | | 8/1992 | Bryan et al. | |
|---|---|---|---|---|---|
| 5,150,006 | A | * | 9/1992 | Van Slyke et al. | 313/504 |
| 5,484,922 | A | | 1/1996 | Moore et al. | |
| 6,303,238 | B1 | * | 10/2001 | Thompson et al. | 428/690 |
| 6,791,258 | B2 | * | 9/2004 | Haase et al. | 313/501 |
| 2003/0129452 | A1 | * | 7/2003 | Tsuji et al. | 428/690 |
| 2007/0054148 | A1 | * | 3/2007 | Matsuo et al. | 428/690 |

FOREIGN PATENT DOCUMENTS

| EP | 0 726 304 A2 | 8/1996 |
|---|---|---|
| JP | 08-109373 | 4/1996 |
| JP | 10-233284 | 9/1998 |
| JP | 2001-271063 A | 10/2001 |
| JP | 2001-326080 A1 | 11/2001 |
| JP | 3445315 | 6/2003 |

OTHER PUBLICATIONS

Shunk et al., "Steroid Analogs Lacking Ring C. I. The Synthesis of 6-Cyclohexyl-Δ1-9-octalone-2 by the Robinson—Mannich Base Method," Journal of the American Chemical Society, vol. 71, No. 12., pp. 3946-3950, Dec. 19, 1949.*

Baldo et al., "Transient analysis of organic electrophosphorescence: I. Transient analysis of triplet energy transfer," Physical Review B, vol. 62, No. 16., pp. 10958-10966, Oct. 15, 2000.*

* cited by examiner

*Primary Examiner*—Marie R. Yamnitzky
(74) *Attorney, Agent, or Firm*—Sughrue Mion, PLLC

(57) ABSTRACT

An organic electroluminescence device of a long emission life is obtained by stacking an anode, a hole transport layer comprising an organic compound, a light emitting layer comprising an organic compound, an electron transport layer comprising an organic compound, and a cathode, in which the light emitting layer comprises an organic host material of an aluminum chelating complex of a specific structure and a phosphorescent organic guest material.

10 Claims, 3 Drawing Sheets

ORGANIC ELECTROLUMINESCENCE DEVICE

TECHNICAL FIELD

The present invention relates to an organic electroluminescence device (hereinafter referred to as an organic EL device) utilizing electroluminescence of an organic compound that emits light by current injection, and having a light emitting layer in which the substance is formed in a layered state.

BACKGROUND ART

In general, each of organic EL devices using an organic material and constituting a display panel has a structure in that an anode as a transparent electrode, plural organic material layers including an organic light emitting layer and a cathode comprising a metal electrode are successively layered each as a thin film on a glass substrate as a display surface. In addition to the organic light emitting layer, the organic material layer includes a layer comprising a material having a hole transportability such as a hole injection layer and a hole transport layer, and a layer comprising a material having electron transportability such as an electron transport layer and an electron injection layer, and an organic EL device of a constitution provided with them has also been proposed. The electron injection layer also contains an in organic compound.

When an electric field is applied to an organic EL device of a stacked body of an organic light emitting layer and an electron or hole transport layer, holes are injected from the anode and electrons are injected from the cathode. The organic EL device utilizes emission of light that is emitted when the electrons and the holes are recombined in the organic light emitting layer to form exciters and they are returned to the ground state. For making the luminous efficiency higher and stably driving the device, a dye is sometimes doped as a guest material to the light emitting layer.

In recent years, in addition to the fluorescence material, use of a phosphorescence material for the light emitting layer has also been proposed, since it is considered that the probability for the occurrence of singlet exciters and triplet exciters after recombination of electrons and holes in the light emitting layer of the organic EL device is 1:3 and it is considered that a device also utilizing phosphorescence caused by the triplet exciters can attain the luminous efficiency three to four times as high as the device using fluorescence caused by the singlet exciters.

On the other hand, for reducing the power consumption improvement of the luminous efficiency and improvement of the driving stability of the organic EL device, it has been proposed to provide a hole blocking layer between the organic light emitting layer and the cathode for restricting the movement of the holes from the organic light emitting layer. By efficient accumulation of the holes in the light emitting layer by the hole blocking layer, the recombination probability with electrons can be improved to attain higher luminous efficiency. As the hole blocking material, it has been reported that phenanthroline derivatives and triazole derivatives are effective (refer to JP-A No. 8-109373 and JP-A No. 10-233284).

In existent organic EL devices utilizing phosphorescence emission, hole transporting materials capable of transporting holes have been used for the light emitting layer host material and materials having higher ionizing potential energy (Ip) than the post material of the light emitting layer such as phenanthroline derivatives, for example, 2,9-dimethyl-4,7-diphenyl-1,10-phenanthroline, i.e., BCP or aluminum chelate complex, for example, ((1,1'-biphenyl)-4-olato)bis(2-methyl-8-quinolinolato NI, 08) aluminum, i.e., BAlq are used as the hole blocking layer in the layer adjacent to the cathode side of the light emitting layer. In a case of using BCP for the hole blocking layer, while the emission characteristics at the initial stage are favorable, it involves a drawback that the driving life is extremely short. At present, materials having sufficiently high Ip and excellent in durability have not been known.

BAlq is excellent in durability but has a drawback of poor hole blocking ability since Ip is not sufficiently high. Accordingly, in a case of using BAlq as the hole blocking layer and tris(8-hydroxyquinolateo N1, 08) aluminum, i.e., Alq3 as the electron transport layer, the electron transport layer emits light. In the organic electroluminescence device utilizing red phosphorescence emission, the emission of Alq3 (green) results in deterioration of chromaticity (orange instead of red).

While it is effective to provide a light emitting layer of an organic phosphorescence material and a hole blocking layer for increasing the luminous efficiency of the organic EL device, it is necessary to further prolong the life of the device. It has been demanded for an organic EL device of high luminance efficiency that is continuously driven to emit light at high luminance with small quantity of current.

DISCLOSURE OF THE INVENTION

It is an object of the present invention to provide an organic EL device capable of prolonging the lifetime of the device.

An organic electroluminescence device according to the invention is an organic electroluminescence device obtained by stacking an anode, a hole transport layer comprising an organic compound, a light emitting layer comprising an organic compound, an electron transport layer comprising an organic compound and a cathode characterized in that the light emitting layer comprises an organic host material represented by the following structural formula (1):

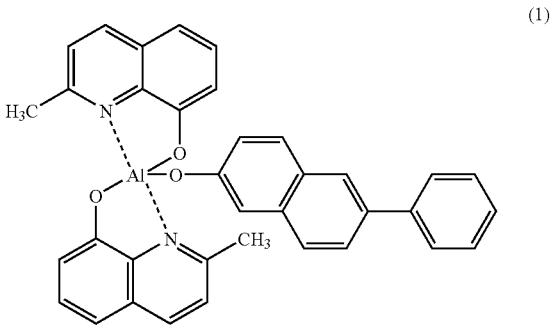

and a phosphorescent organic guest material.

The electroluminescence device according to the invention is characterized in that a hole injection layer is provided between the anode and the hole transport layer.

The electroluminescence device according to the invention is characterized in that an electron injection layer is provided between the cathode and the electron transport layer.

The organic electroluminescence device according to the invention is characterized in that the phosphorescent organic guest material comprises a porphyrin compound represented by the following structural formula (2):

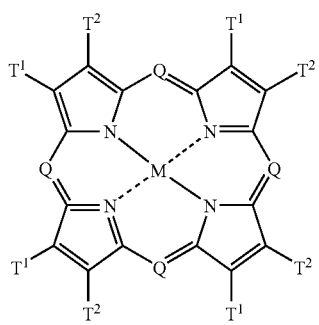

(2)

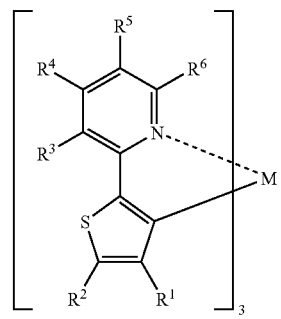

(4)

(in the structural formula (2), Q represents —N= or —C(R)=, M represents a metal, a metal oxide or a metal halide, R represents hydrogen, alkyl, aralkyl, aryl or alkaryl, or a halogenated substituent thereof, $T^1$ and $T^2$ each represents hydrogen or alkyl, or jointly represent a completed unsaturated six-membered ring including a halogen substituent, the six-membered ring is formed of carbon, sulfur and nitrogen ring atoms, and the alkyl moiety contains 1 to 6 carbon atoms).

The organic electroluminescence device according to the invention is characterized in that M in the phosphorescent organic guest material is platinum.

The organic electroluminescence device according to the invention is characterized in that the phosphorescent organic guest material comprises a compound represented by the following structural formula (3):

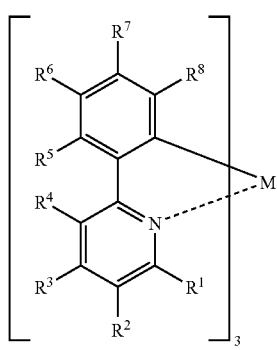

(3)

(in the structural formula (3), M represents a metal, $R^1$ to $R^8$ each independently includes a hydrogen atom, alkyl group, oxy group, amino group or a hydrocarbon group having at least one carbon atom in the substituent, the number of carbon atoms is 1 to 10 in each of the hydrocarbon moieties, further, $R^1$ to $R^8$ can be selected independently from cyano, halogen, and α-haloalkyl, α-haloalkoxy, amide, sulfonyl, carbonyl, carbonyloxy and oxycarbonyl substituents containing 10 or less carbon atom and, further, $R^1$ together with $R^2$, $R^2$ together with $R^3$, $R^3$ together with $R^4$, $R^5$ together with $R^6$, $R^6$ together with $R^7$, or $R^7$ together with $R^8$ can form a condensed benzo ring).

The organic electroluminescence device according to the invention is characterized in that M for the phosphorescent organic guest material is iridium.

The organic electroluminescence device according to the invention is characterized in that the phosphorescent organic guest material comprises a compound represented by the following structural formula (4):

(in the structural formula (4), M represents a metal, $R^1$ to $R^6$ each independently includes a hydrogen atom, alkyl group, oxy group, amino group, or a hydrocarbon group having at least one carbon atom in the substituent, the number of carbon atoms is 1 to 10 in each of the hydrocarbon moieties, further, $R^1$ to $R^6$ can be selected independently from cyano, halogen, and α-haloalkyl, α-haloalkoxy, amide, sulfonyl, carbonyl, carbonyloxy and oxycarbonyl substituents containing 10 or less of carbon atoms and, further, $R^1$ together with $R^2$, $R^3$ together with $R^4$, $R^4$ together with $R^5$, or $R^5$ together with $R^6$ can form a condensed benzo ring).

The organic electroluminescence device according to the invention is characterized in that M in the phosphorescent organic guest material is iridium.

The organic electroluminescence device according to the invention is characterized in that the phosphorescent organic guest material comprises a compound represented by the following structural formula (6):

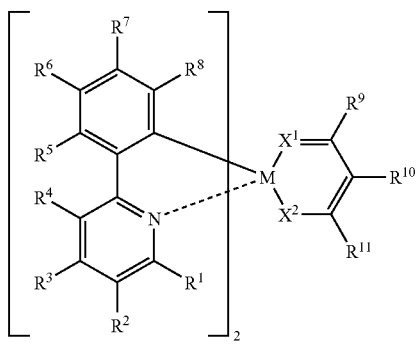

(5)

(in the structural formula (5), M represents iridium, $X^1$ and $X^2$ each independently represents an oxygen atom or a sulfur atom, $R^1$ to $R^{11}$ each independently includes a hydrogen atom, alkyl group, oxy group, amino group, or a hydrocarbon group having at least one carbon atom in the substituent, the number of carbon atoms is 1 to 10 in each of the hydrocarbon moieties, further, $R^1$ to $R^{11}$ can be selected independently from cyano, halogen, and α-haloalkyl, α-haloalkoxy, amide, sulfonyl, carbonyl, carbonyloxy and oxycarbonyl substituents containing 10 or less carbon atoms and, further, $R^1$ together with $R^2$, $R^2$ together with $R^3$, $R^3$ together with $R^4$, $R^5$ together with $R^6$ or $R^6$ together with $R^7$, $R^7$ together with $R^8$, $R^8$ together with $R^9$, or $R^{10}$ together with $R^{11}$ can form a condensed benzo ring).

The organic electroluminescence device according to the invention is characterized in that the phosphorescent organic guest material comprises a compound represented by the following structural formula (6):

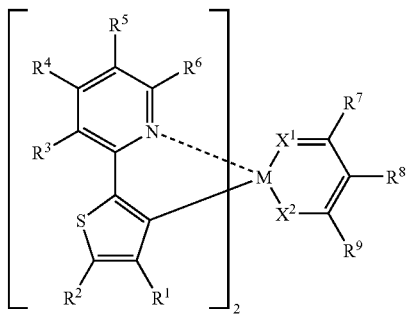

(6)

(in the structural formula (6), M represents iridium, $X^1$ and $X^2$ each independently represents an oxygen atom or a sulfur atom, $R^1$ to $R^9$ each independently includes a hydrogen atom, alkyl group, oxy group, amino group or a hydrocarbon group having at least one carbon atom in the substituent, the number of carbon atoms is 1 to 10 in each of the hydrocarbon moieties, further, $R^1$ to $R^9$ can be selected independently from cyano, halogen, and α-haloalkyl, α-haloalkoxy, amide, sulfonyl, carbonyl, carbonyloxy and oxycarbonyl substituents containing 10 or less of carbon atoms and, further, $R^1$ together with $R^2$, $R^3$ together with $R^4$, $R^4$ together with $R^5$, $R^5$ together with $R^6$, $R^7$ together with $R^8$, or $R^8$ together with $R^9$ can form a condensed benzo ring).

DISCLOSURE OF INVENTION

Embodiments of the present invention are to be described with reference to the drawings.

Figure 1:
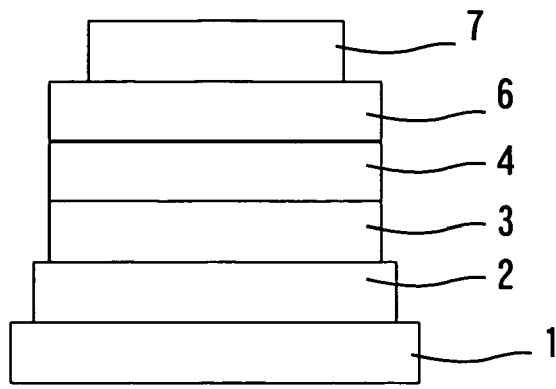
FIG. 1 is a structural view showing an organic EL device according to the present invention.

An organic EL device according to the invention comprises, as shown in FIG. 1, at least an anode 2, a hole transport layer 3, a light emitting layer 4, an electron transport layer 6 and a cathode 7, which is obtained by stacking, on a transparent substrate 1 for example made of glass, a transparent anode 2, a hole transport layer 3 comprising an organic compound, a light emitting layer 4 comprising an organic compound, an electron transport layer 6 comprising an organic compound and a metal cathode 7 made, for example, of a material with low work function. In the organic EL device according to the invention, the light emitting layer 4 is an organic material having an electron transportability doped with an organic host material represented by the following structural formula (1):

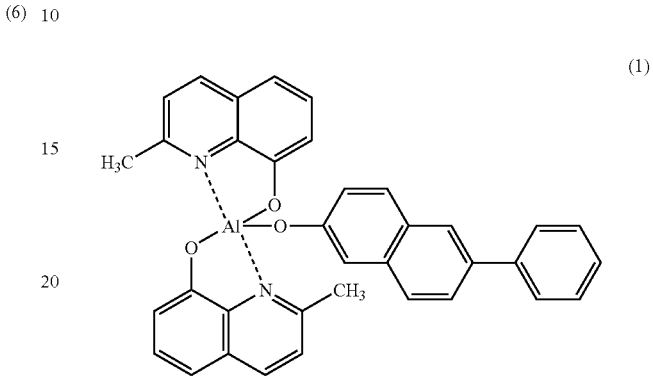

(1)

and a phosphorescent material as an organic guest material. In the light emitting layer 4, the organic guest material is preferably doped such that a kind of material is doped at a ratio of from 4 to 10% by weight based on the entire kinds of materials.

An example of a specific organic EL element includes a constitution of using ITO for the anode, 4,4-bis(N-(naphthyl)-N-phenyl-amino)biphenyl, i.e., NPB (Ip=5.4 eV), for the hole transport layer, an organic host material represented by the structural formula (1) for the light emitting layer, Alq3 for the electron transport layer and an aluminum for the cathode. The glass transition temperature of the compound of the structural formula (1) is 113° C. which is higher by about 15° C. than that of BAlq as the known compound having a similar structure. This enables further stabilization for the electrical and physical characteristics of the thin film in the organic EL device, high storability at high temperature and suppression for the degradation of luminance during continuous driving. Further, the ligand of the compound of the structural formula (1) has a longer conjugation system compared with biphenol as the ligand for BAlq and the electron transportability is improved as well. Accordingly, the compound of the structural formula (1) is effective as a material for the organic electric field light emitting material.

Figure 2:
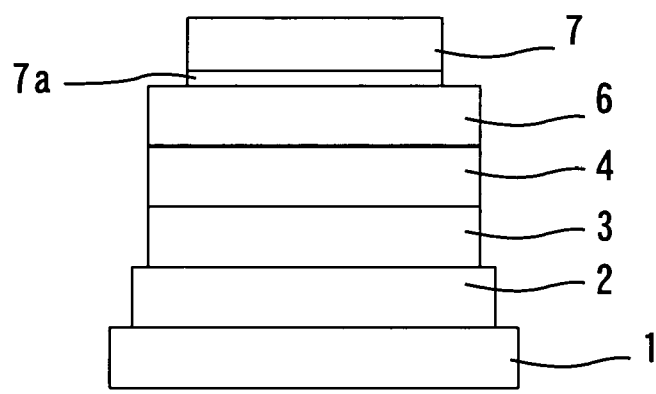
FIG. 2 is a structural view showing an organic EL device according to the invention.

In addition to the structure described above, another organic EL device structure also includes as shown in FIG. 2, a structure in which an electron injection layer 7a made of $Li_2O$, etc. is stacked and deposited as a thin film between the electron transport layer 6 ad the cathode 7.

Figure 3:
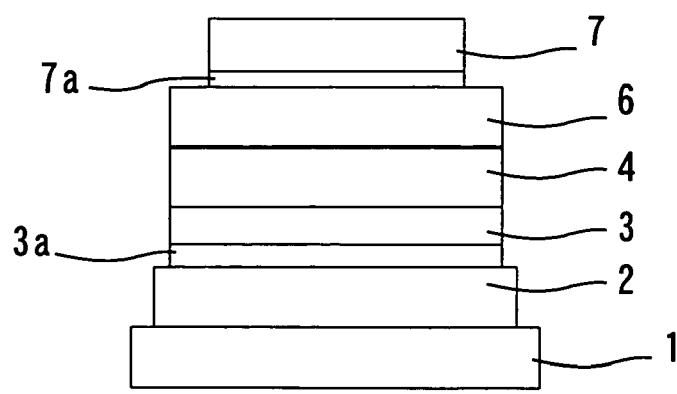
FIG. 3 is a structural view showing an organic EL device according to the invention.
Figure 4:
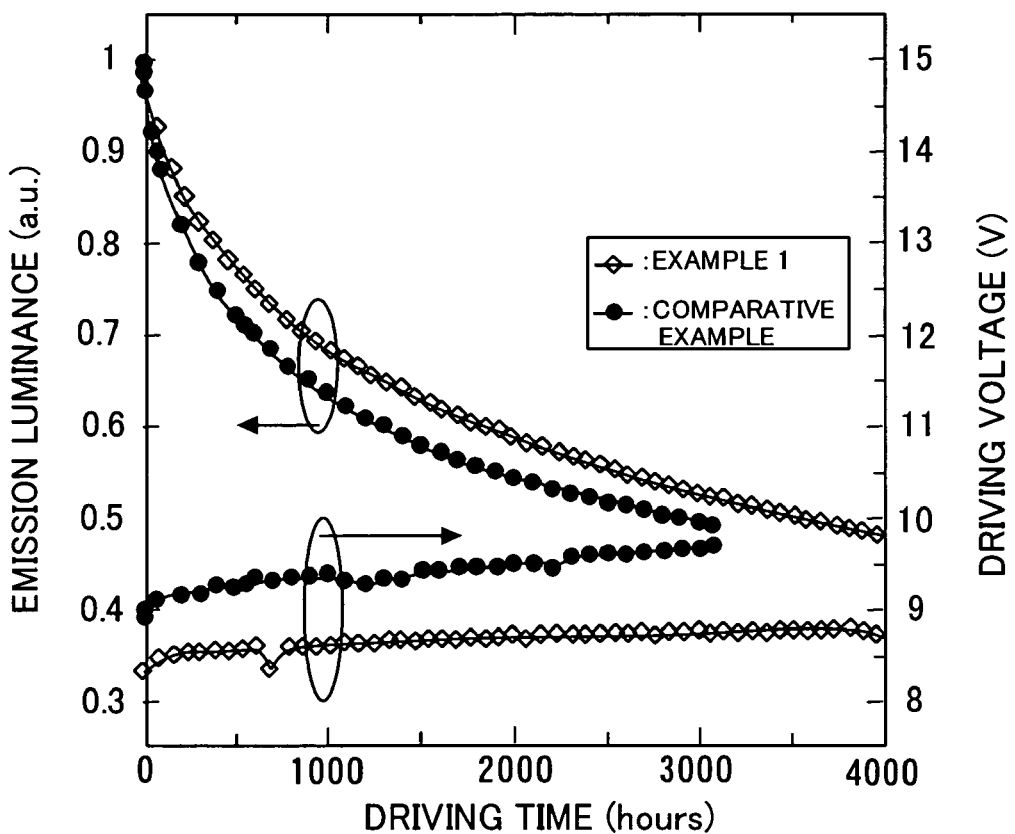
FIG. 4 is a graph showing characteristics for deterioration of luminance and driving voltage of the organic EL device in Example 1 according to the invention.

In addition to the structure described above, a further organic EL device structure also includes as shown in FIG. 3, a structure in which a hole injection 3a such as made of a porphyrin compound, for example, copper phthalocyanine (CuPc) stacked and deposited as a thin film between the anode 2 and the hole transport layer 3.

For the cathode 1, a material comprising a metal of a small work function, for example, aluminum, magnesium, indium, silver or an alloy for each of them and having a thickness of about 100 to 5000 Angstrom can be used. Further, for the anode 2, a conductive material of large work function, for example, indium tin oxide (hereinafter referred to as ITO) and having a thickness of about 1000 to 3000 angstrom or gold having a thickness of about 800 to 1500 angstrom can be used. In a case of using gold for the electrode material, the electrode is in a semi-transparent state. It may suffice that one of the cathode and the anode is transparent or semi-transparent.

In the embodiment, the ingredient contained in the hole transport layer 3 is a substance having a hole transportability, for example, represented by the following formulae (7) to (32).

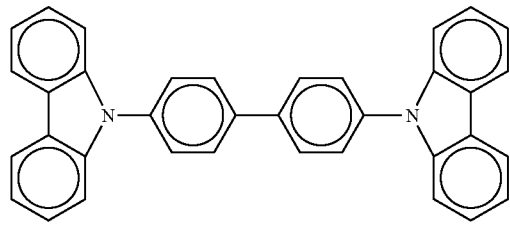

(7)

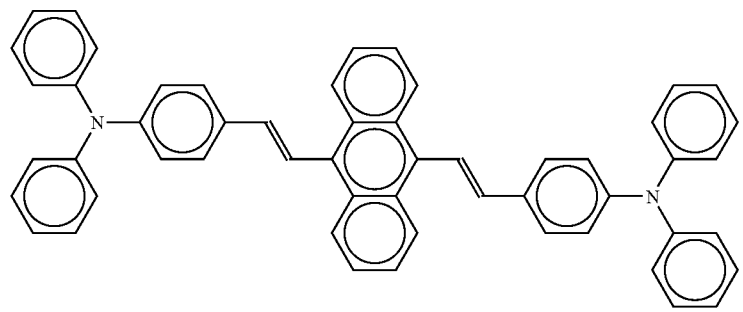

(8)

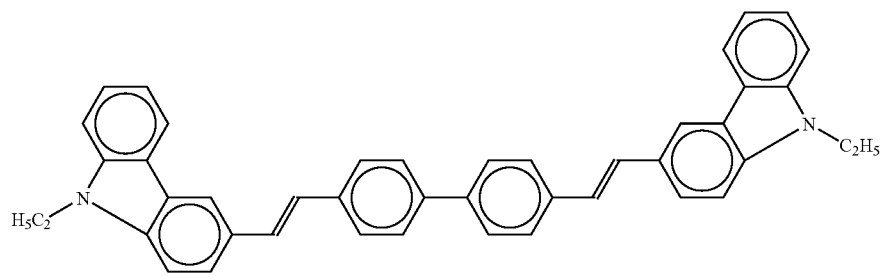

(9)

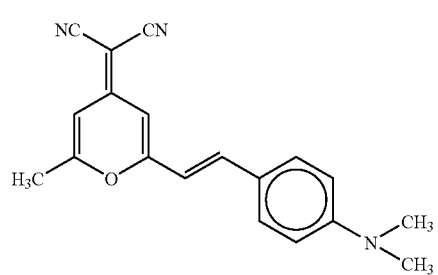

(10)

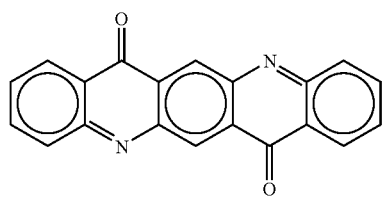

(11)

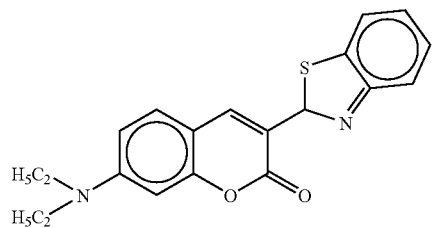

(12)

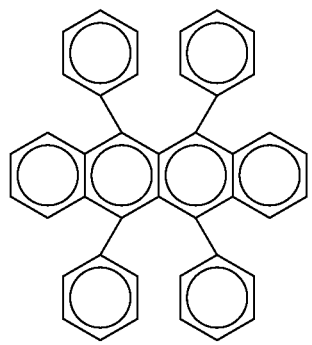

(13)

-continued
(14)
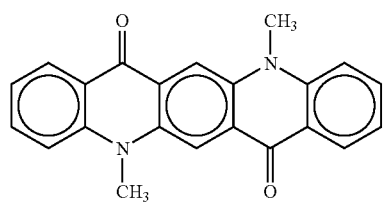
(15)
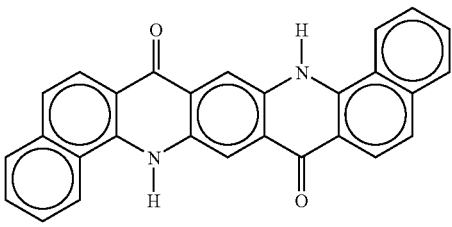
(16)
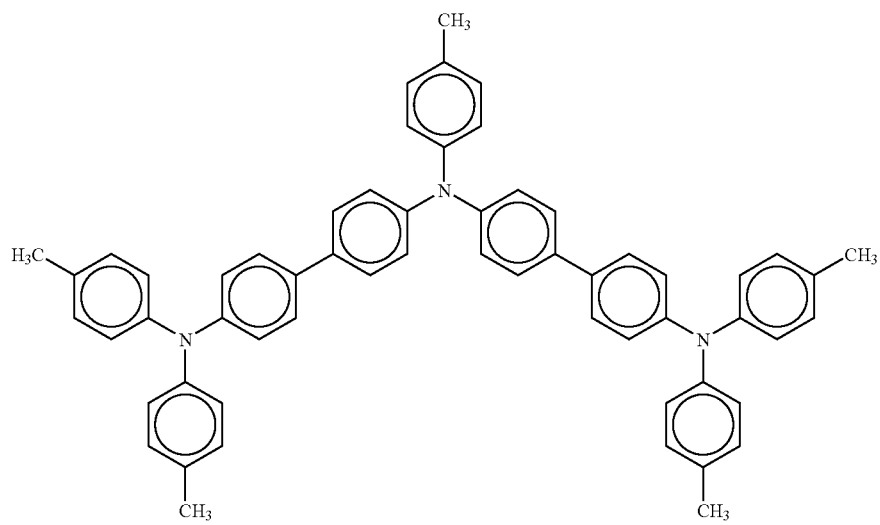
(17)
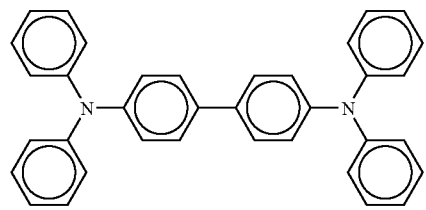
(18)
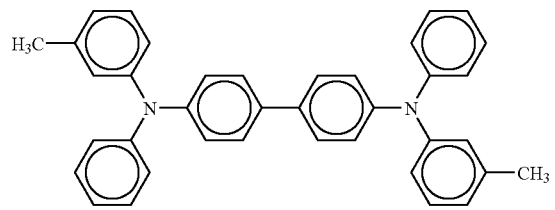
(19)
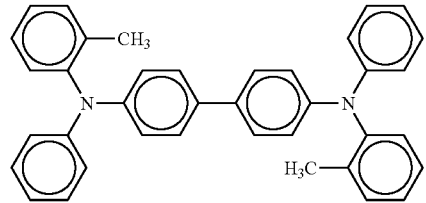
(20)
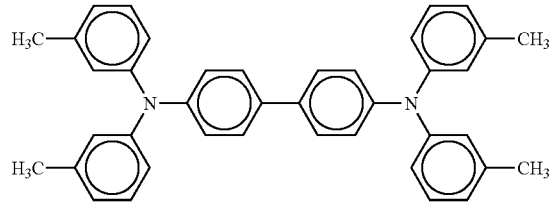
(21)
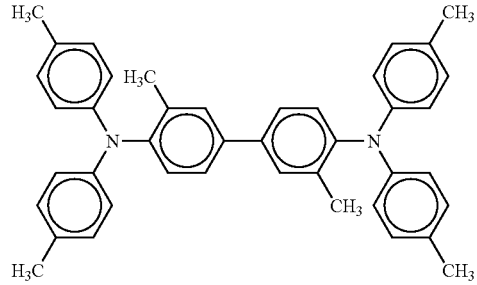
(22)
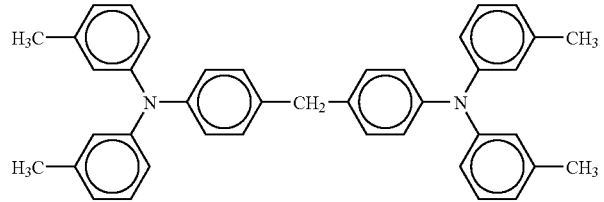

-continued
(23)
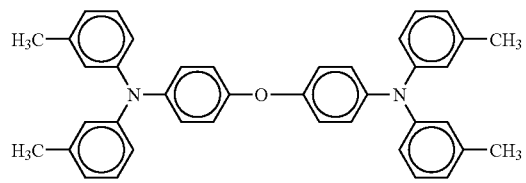
(24)
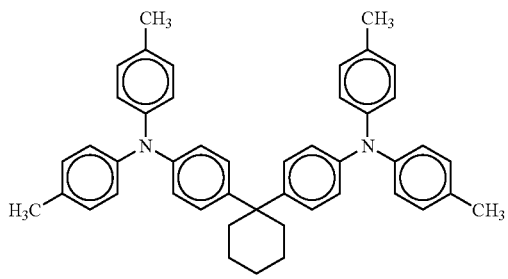
(25)
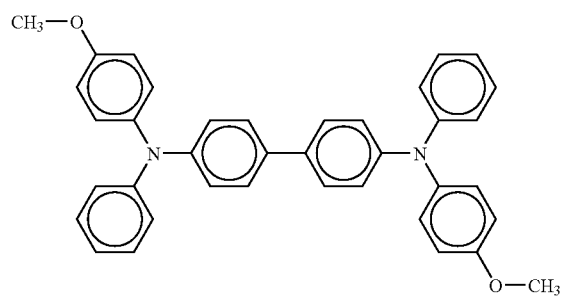
(26)
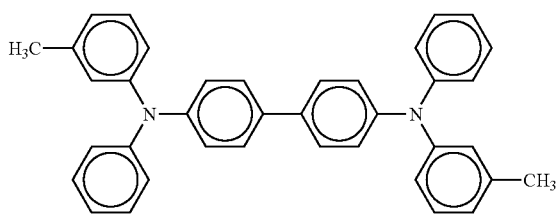
(27)
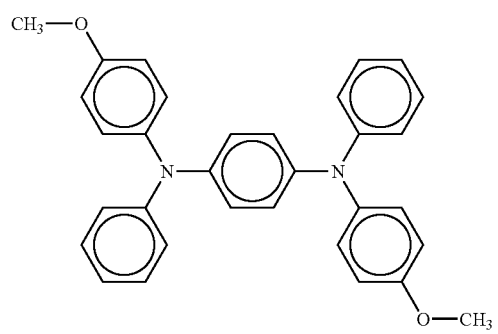
(28)
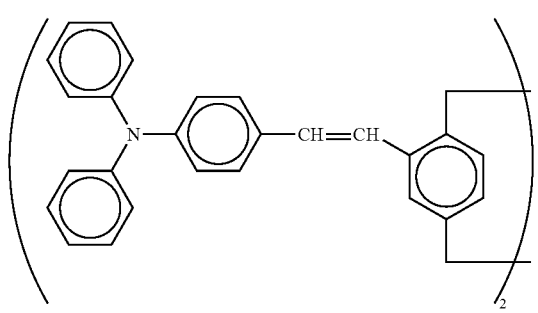
(29)
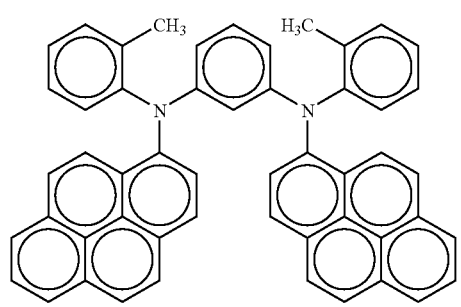
(30)
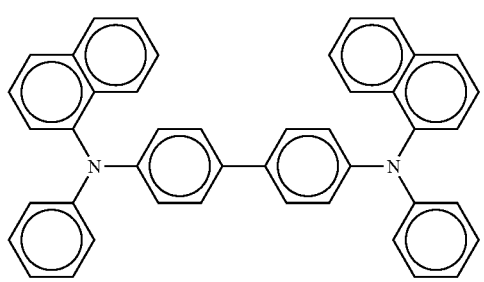

(31)
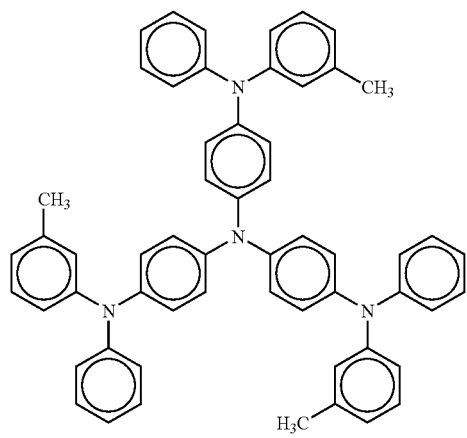
(32)
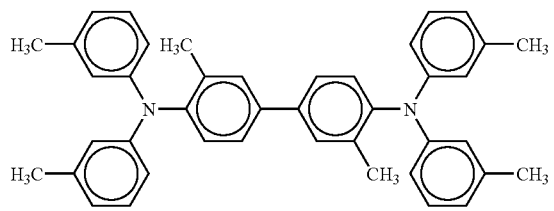
In the embodiment, the ingredient contained in the electron transport layer 6 can be selected from the materials represented, for example, by the following formulae (33) to (51).
(33)
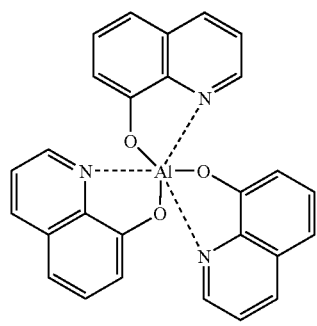
(34)
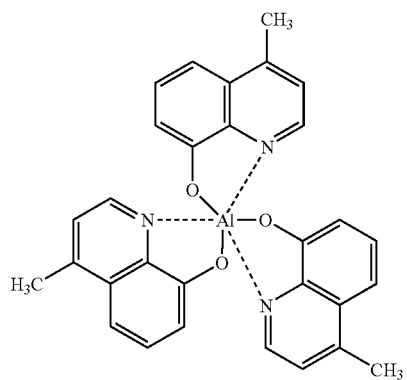
(35)
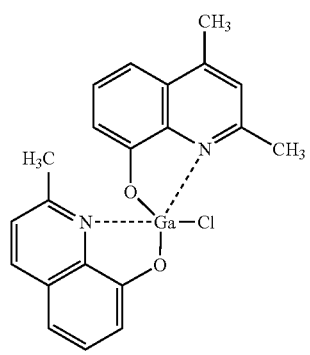
(36)
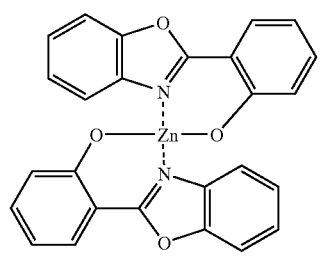

-continued
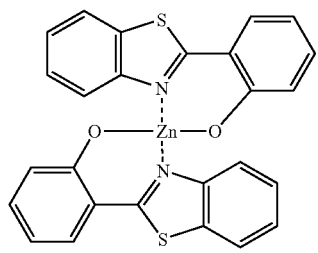
(37)
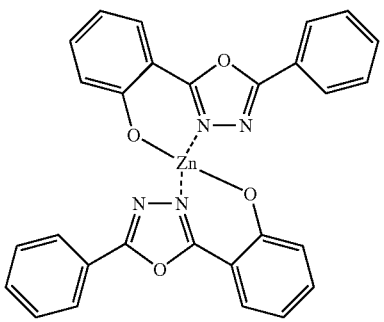
(38)
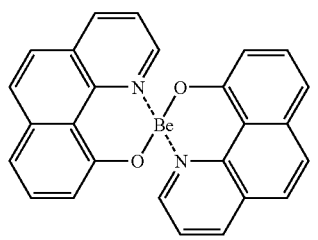
(39)
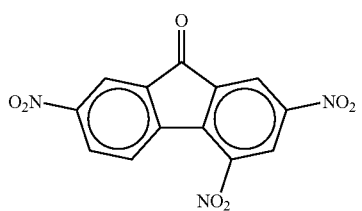
(40)
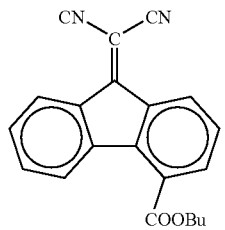
(41)
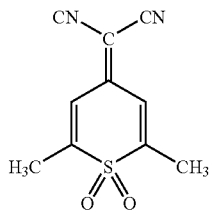
(42)
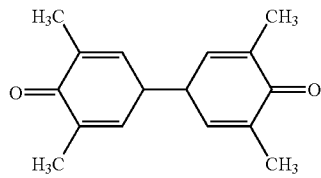
(43)
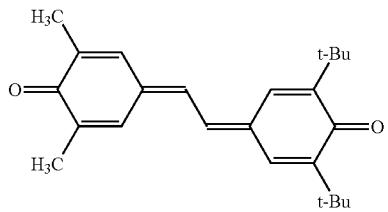
(44)
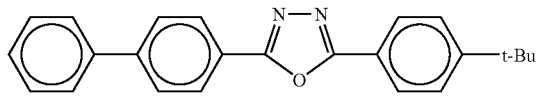
(46)
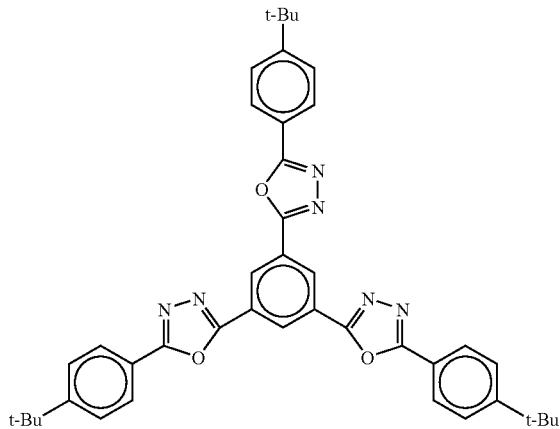
(45)
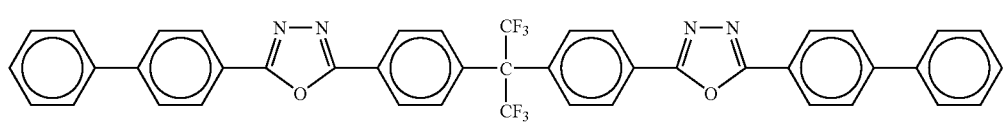
(47)

-continued
(48)
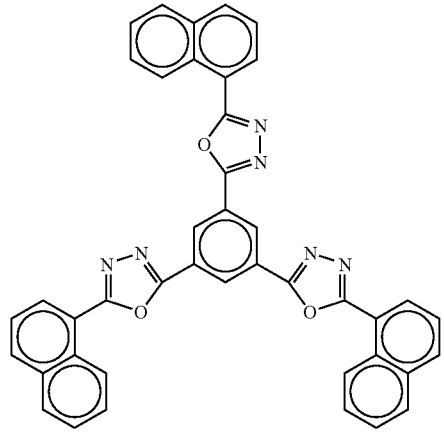
(49)
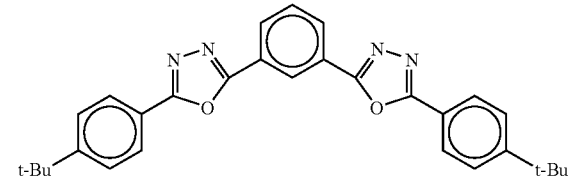
(50)
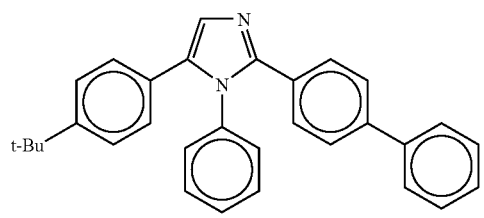
(51)
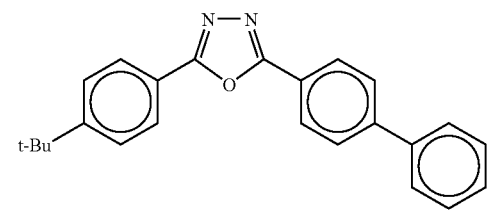
In the formulae described above, Bu represents a butyl group and t-Bu represents a tertiary butyl group.
Further, the organic material having the electron transportability also includes aluminum chelate complexes represented by the following formulae (52) to (87).
(52)
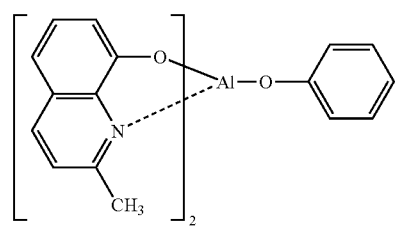
-continued
(55)
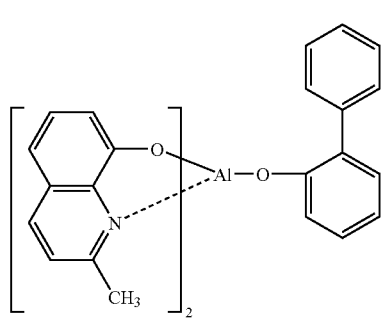
(53)
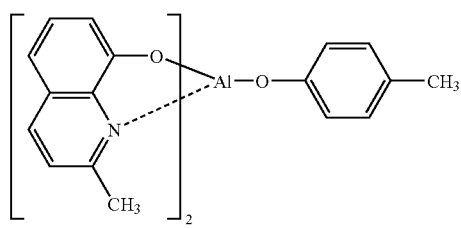
(56)
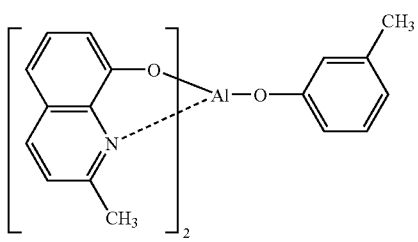
(54)
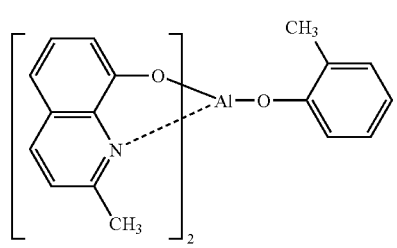
(57)
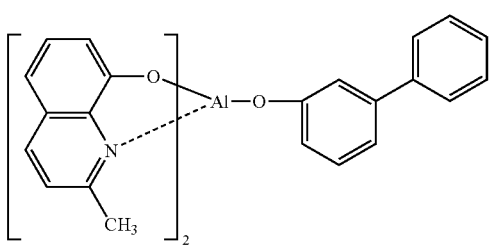

-continued
(58)
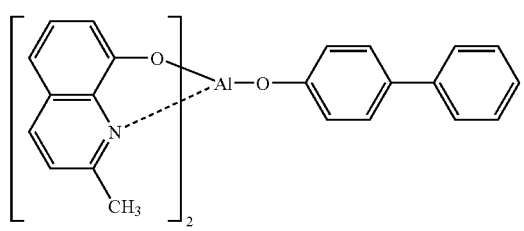
(59)
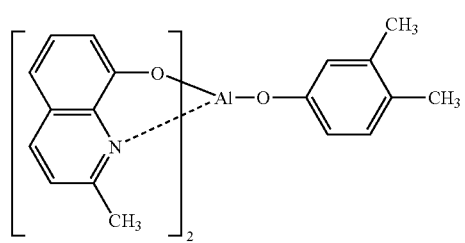
(60)
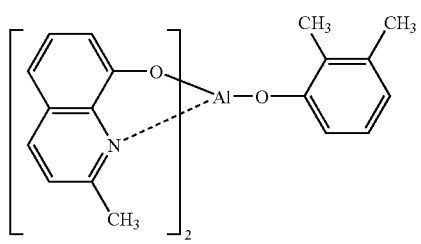
(61)
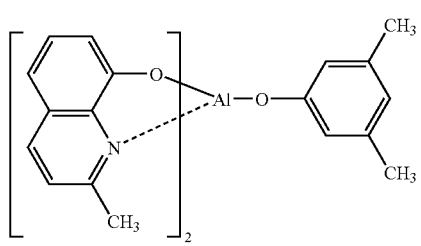
(62)
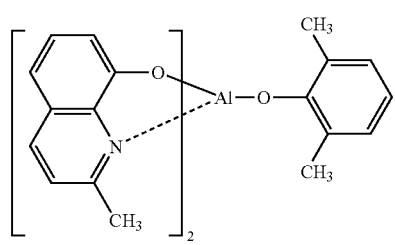
(63)
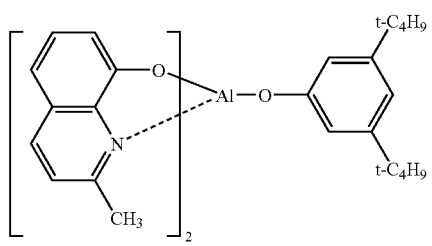
-continued
(64)
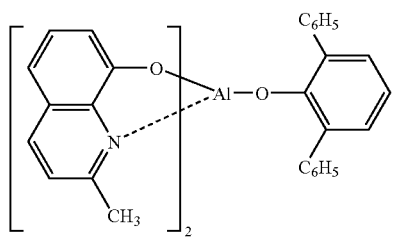
(65)
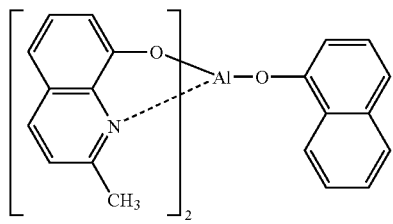
(66)
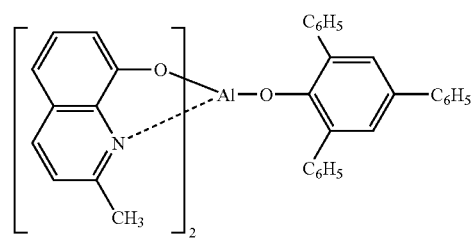
(67)
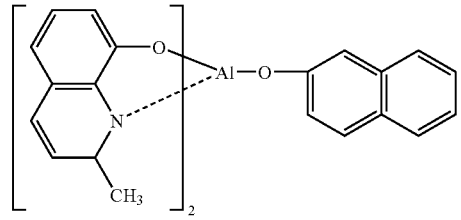
(68)
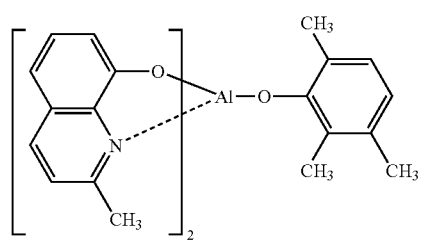
(69)
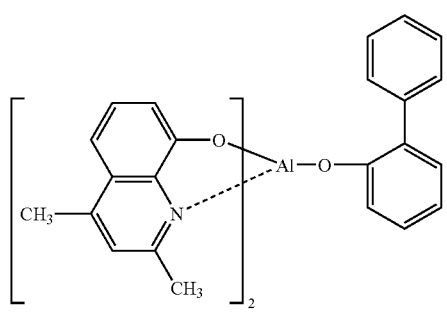

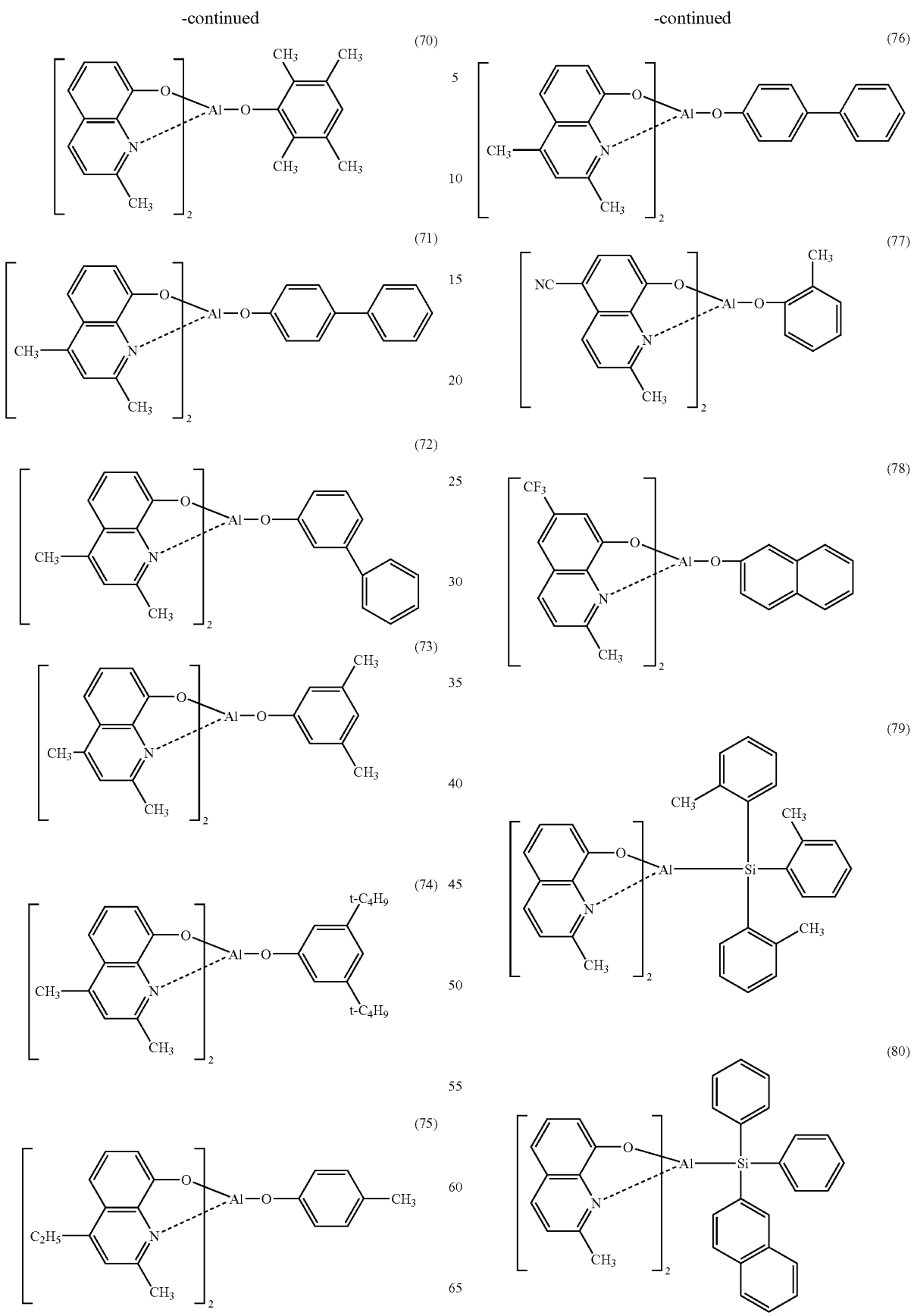

-continued
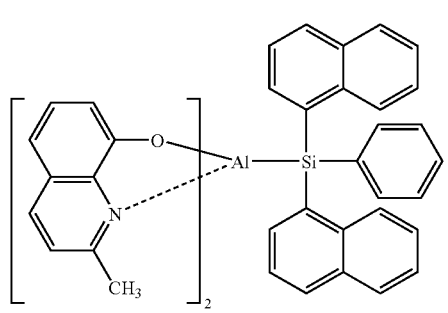
(81)
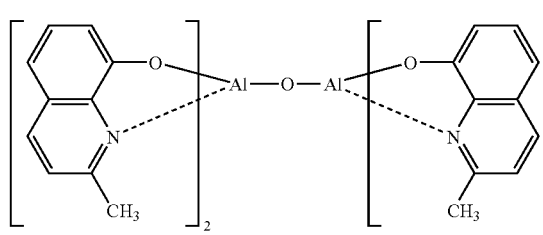
(82)
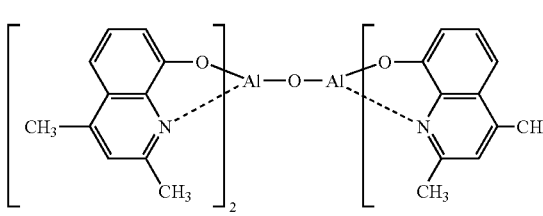
(83)
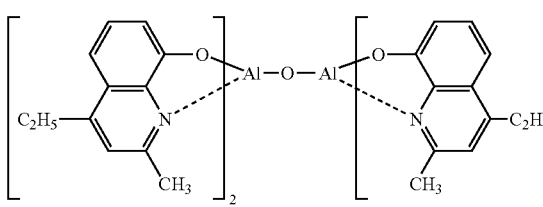
(84)
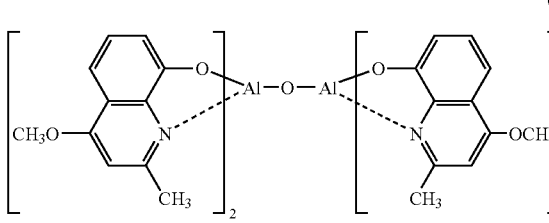
(85)
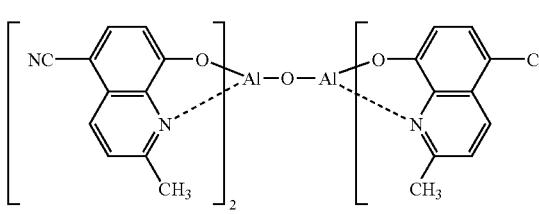
(86)
-continued
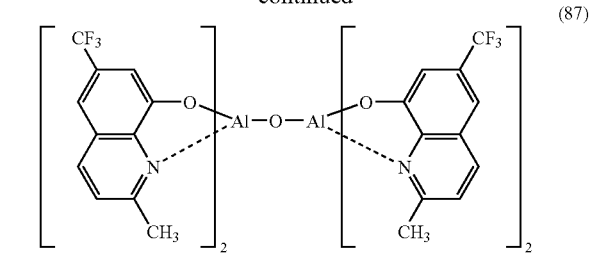
(87)
Further, the organic material having the electron transportability usable for the electron transport layer 6 can also be selected from phenanthroline derivatives represented by the following formulae (88) to (96):
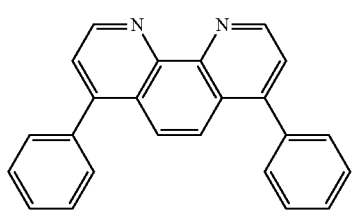
(88)
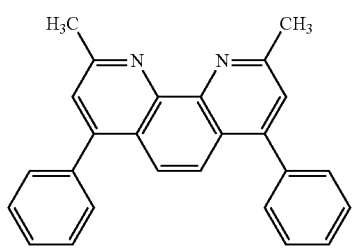
(89)
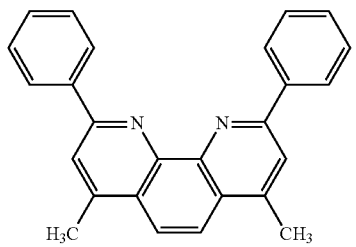
(90)
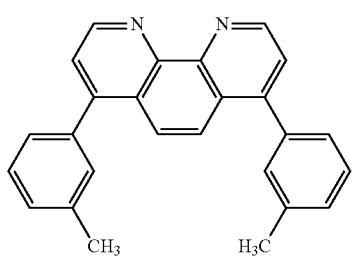
(91)

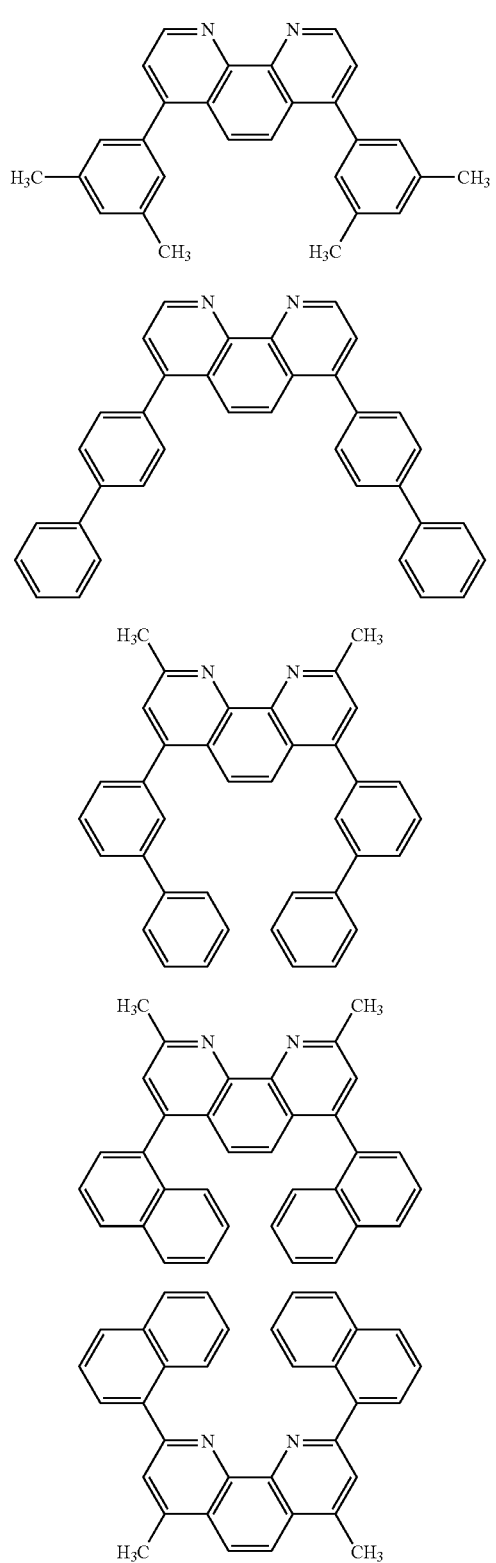
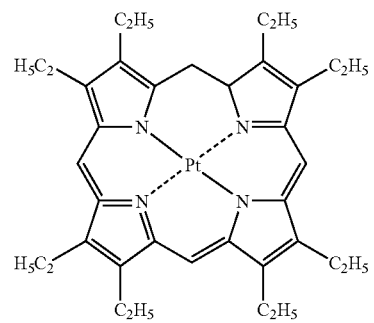
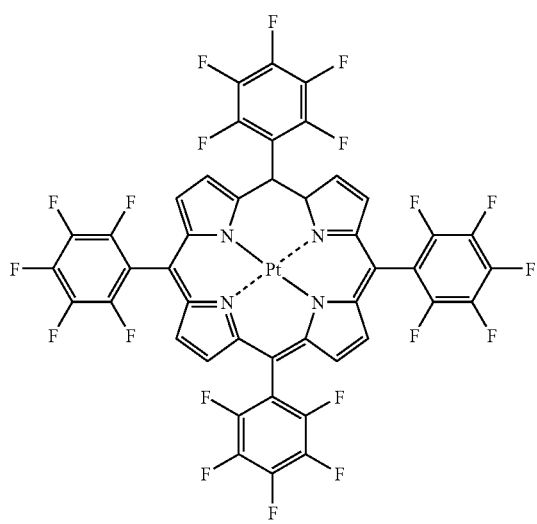
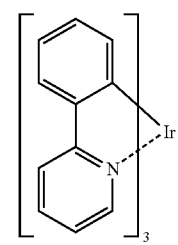
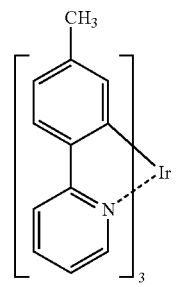
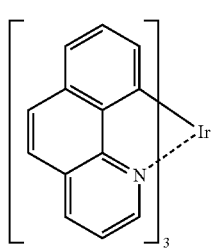
The phosphorescent organic guest material for use in light emitting layer 4 can also be selected from the compounds shown by the structural formulae (2) to (6), for example, materials shown by the following formulae (97) to (106):

-continued

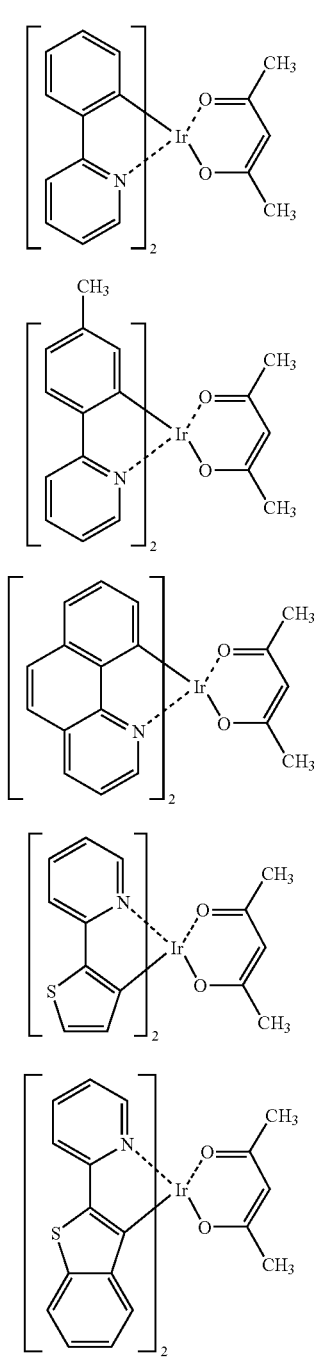

(102)

(103)

(104)

(105)

(106)

Example 1

Plural organic EL devices were manufactured as samples specifically and light emitting characteristics thereof were evaluated.

For the samples, copper phthalocyanine (CuPc) was used as the hole injection layer, NPB was used as the hole transport layer and Alq3 was used as the electron transport layer. In common with the samples, thin films of the respective materials were stacked successively on a glass substrate formed with an anode made of ITO with a film thickness of 1100 Å by vacuum vapor deposition at a vacuum degree of $5.0 \times 10^{-6}$ Torr.

At first, in sample 1, CuPc was deposited as a film to 250 Å thickness on a ITO cathode at a vapor deposition rate of 3 Å/sec, to form a hole injection layer.

Then, NPB was deposited as a film to 550 Å thickness on a CuPc hole injection layer at a vapor deposition rate of 3 Å/sec to form a hole transport layer.

Then, on the NPB hole transport layer, an organic host material of the structural formula (1) and an organic guest material XT emitting red phosphorescence among the compounds shown by the structural formula (6) were co-deposited from different vapor deposition sources to 475 Å thickness to form a light emitting layer. In this process, the concentration of the organic guest material XT in the light emitting layer was 7 wt %.

Then, on the mixed light emitting layer, Alq3 was vapor deposited to 300 Å thickness at a vapor deposition rate of 3 Å/sec to form an electron transport layer.

Further, on the Alq3 electron transport layer, lithium oxide ($Li_2O$) was vapor deposited as an electron injection layer to 10 Å at a vapor deposition rate of 0.1 Å/sec and, further thereon, aluminum (Al) was stacked as the cathode to 1000 Å at 10 Å/sec, to manufacture an organic light emitting device of the example.

As a comparative example, a device of comparative example identical with that of Example 1 was also manufactured except for using BAlq for the organic host material in the mixed light emitting layer.

FIG. 1 shows change of degradation of luminance and driving voltage when Example 1 and Comparative Example were driven continuously at a constant current of 5.5 $mA/cm^2$ from the initial luminance of 340 $cd/m^2$. In the device of Example 1, the luminance half-decay period was extended compared with the comparative example and the luminance life was excellent. Change of the driving voltage (increase) is one of parameters showing the degradation of the material along with continuous driving.

Light emitting characteristics of the devices of Example 1 and the comparative example in a storage test at 100° C. were evaluated.

Table 1 and Table 2 show the change of chromaticity, luminance and voltage relative to lapse of time in a case of driving the devices of Example 1 and Comparative Example at 5.5 $mA/cm^2$ respectively.

TABLE 1

| Lapse of time | Chromaticity diagram | | Luminance | Driving voltage |
|---|---|---|---|---|
| (hours) | CIEx | CIEy | ($cd/m^2$) | (V) |
| 0 | 0.676 | 0.321 | 326 | 8.41 |
| 63 | 0.676 | 0.323 | 322 | 7.70 |
| 159 | 0.673 | 0.324 | 292 | 7.24 |
| 324 | 0.672 | 0.325 | 239 | 7.09 |
| 500 | 0.667 | 0.328 | 197 | 6.86 |

TABLE 2

| Lapse of time | Chromaticity diagram | | Luminance | Driving voltage |
|---|---|---|---|---|
| (hours) | CIEx | CIEy | ($cd/m^2$) | (V) |
| 0 | 0.678 | 0.321 | 337 | 9.20 |
| 63 | 0.677 | 0.323 | 269 | 6.93 |
| 159 | 0.576 | 0.386 | 66 | 6.51 |

TABLE 2-continued

| Lapse of time | Chromaticity diagram | | Luminance | Driving voltage |
|---|---|---|---|---|
| (hours) | CIEx | CIEy | (cd/m$^2$) | (V) |
| 324 | 0.528 | 0.416 | 63 | 6.79 |
| 500 | 0.525 | 0.423 | 65 | 6.92 |

When the organic EI device of the example was stored under the circumstance at 100° C., the luminance was lowered by 40% relative to the initial value at lapse of 500 hrs. Further, change of the chromaticity was also observed scarcely in the example.

On the contrary, for the lowering of the luminance of the device of the comparative example, the luminance was lowered by 80% relative to the initial value at lapse of 160 hrs at 100° C. Further, change of chromaticity was observed and the emission color changed from red to yellow.

The glass transition temperature Tg of the structural formula (1) of the organic host material is 113° C. and the glass transition temperature Tg of BAlq is 99° C. It is considered that since the organic host material of the light emitting layer of the example had higher Tg than that of the comparative example and the physical and electrical characteristics of the thin film in the organic EL device were stable, the degradation of luminance during continuous driving was suppressed and the driving life was improved compared with the device of the comparative example.

Further, since the organic host material shown by the structural formula (1) had a ligand of longer conjugation system compared with BAlq used in the comparative example, it is excellent in the electron transportability.

The organic EL device using the organic host material shown by the structural material (1) as the light emitting layer had more preferred current luminance characteristics than those of the device using BAlq as the light emitting layer and suffered from less lowering of efficiency, particularly, in a higher luminance region exceeding 300 cd/m$^2$.

Example 2

A devices was manufactured quite in the same manner as Example 1 except for using 2,3,7,8,12,13,17,18-octaethyl-21H,23H-porphinePlatinum (II) (so-called PtOEP), instead of the organic guest material XT, as the phosphorescent organic guest material under the identical condition.

Figure 5:
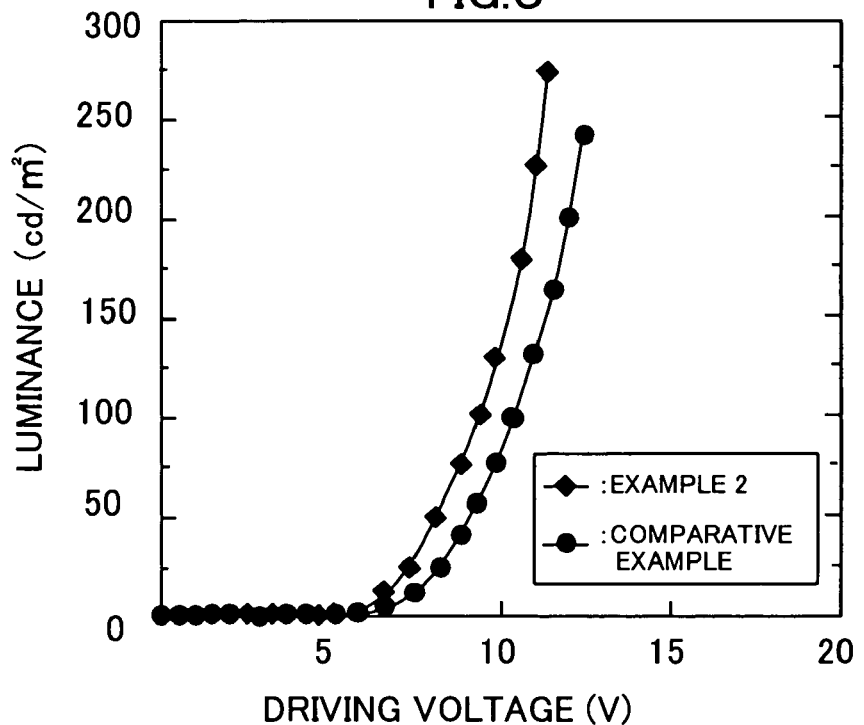
FIG. 5 is a graph showing the voltage-luminance characteristics of the organic EL device in Example 2 according to the invention.
Figure 6:
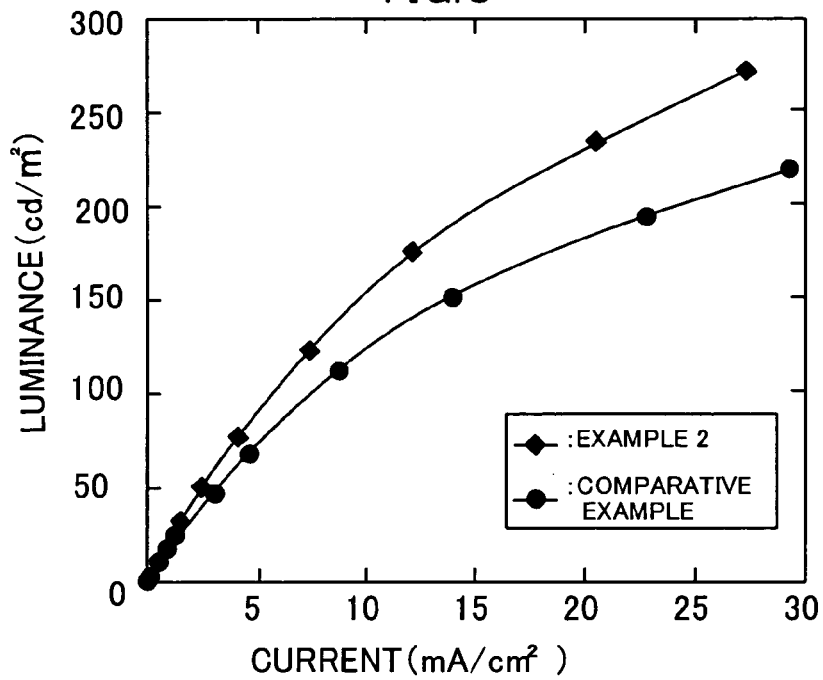
FIG. 6 is a graph showing the current-luminance characteristics of the organic EL device in Example 2 according to the invention.

For the devices of Example 2 and the comparative example, Table 3 shows the light emitting characteristics during continuous driving at a constant current of 2.5 mA/cm$^2$, FIG. 5 shows voltage-luminance characteristics, and FIG. 6 shows current-luminance characteristics, respectively. The device of Example 2 using the material of the structural formula (1) of the invention for the host material in the light emitting layer had more satisfactory voltage-luminance characteristics and current characteristics compared with the device of the comparative example. That is, the device of high efficiency and low driving voltage could be obtained by using the material shown by the structural formula (1) as the host material of the light emitting layer.

TABLE 3

| | Chromaticity diagram | | Luminance | Quantum efficiency | Driving |
|---|---|---|---|---|---|
| | CIEx | CIEy | (cd/m$^2$) | (%) | voltage (V) |
| Example 2 | 0.695 | 0.294 | 43 | 5.35 | 8.85 |
| Comp. Example | 0.709 | 0.283 | 38 | 4.89 | 9.66 |

Figure 7:
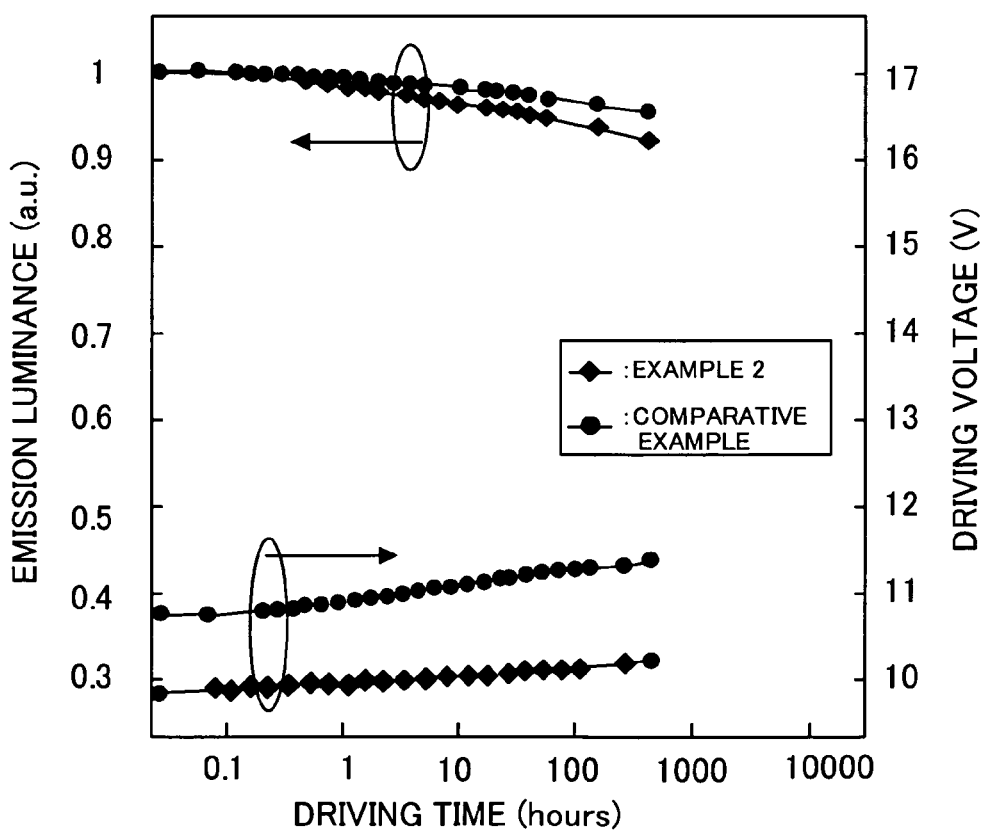
FIG. 7 is a graph showing characteristics for deterioration of luminance and driving voltage of the organic EL device in Example 2 according to the invention.

FIG. 7 shows the change of degradation of luminance and driving voltage during continuous driving at a constant current of 7.5 mA/cm$^2$. At the lapse of 300 hrs, both the device of Example 2 and the device of the comparative example maintained 95% or more of the initial luminance. For the driving voltage, it increased by 6.4% at the lapse of time of 300 hrs in the device of the comparative example, whereas it was suppressed to 3.5% in the device of Example 2.

As has been described above, according to the present invention, since the organic host material of an aluminum chelate complex of the specified structure shown by the structural formula (1) is used as the main ingredient of the light emitting layer in the organic EL device having the light emitting layer using the phosphorescent material for the organic guest material, it is excellent in heat resistance and can attain a long driving life while maintaining favorable light emitting characteristics.

The invention claimed is:

1. An organic electroluminescence device comprising an anode; a hole transport layer comprising an organic compound; a light emitting layer having an organic compound; an electron transport layer having an organic compound: and a cathode which are stacked, characterized in that the light emitting layer includes an organic host material represented by the following structural formula (1):

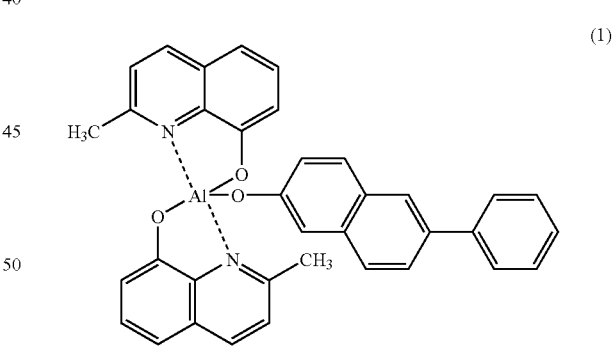

(1)

and a phosphorescent organic guest material.

2. An organic electroluminescence device according to claim 1, wherein a hole injection layer is provided between the anode and the hole transport layer.

3. An organic electroluminescence device according to claim 1 or claim 2, wherein an electron injection layer is provided between the cathode and the electron transport layer.

4. An organic electroluminescence device according to claim 1, wherein the phosphorescent organic guest material comprises a porphyrin compound represented by the following structural formula (2):

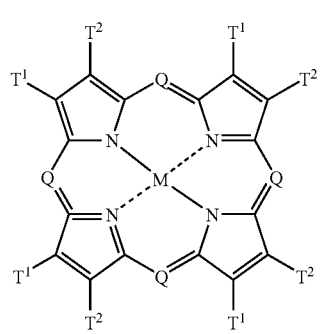

(2)

in the structural formula (2), Q represents —N= or —C(R)=; M represents a metal, a metal oxide, or a metal halide, R represents hydrogen, alkyl, aralkyl, aryl or alkaryl, or a halogenated substituent thereof, $T^1$ and $T^2$ each represents hydrogen or alkyl, or jointly represent a completed unsaturated six-membered ring including a halogen substituent, the six-membered ring is formed of carbon, sulfur and nitrogen ring atoms, and the alkyl moiety contains 1 to 6 carbon atoms.

5. An organic electroluminescence device according to claim 4, wherein M in the phosphorescent organic guest material is platinum.

6. An organic electroluminescence device according to claim 1, wherein the phosphorescent organic guest material comprises a compound represented by the following structural formula (3):

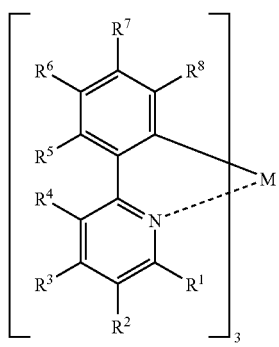

(3)

in the structural formula (3), M represents iridium, $R^1$ to $R^8$ each independently includes a hydrogen atom, alkyl group, oxy group, amino group or a hydrocarbon group having at least one carbon atom in the substituent, the number of carbon atoms is 1 to 10 in each of the hydrocarbon moieties, further, $R^1$ to $R^8$ can be selected independently from cyano, halogen, and α-haloalkyl, α-haloalkoxy, amide, sulfonyl, carbonyl, carbonyloxy and oxycarbonyl substituents containing 10 or less carbon atoms, and further, $R^1$ together with $R^2$, $R^2$ together with $R^3$, $R^3$ together with $R^4$, $R^4$ together with $R^5$, $R^5$ together with $R^6$, $R^6$ together with $R^7$, or $R^7$ together with $R^8$ can form a condensed benzo ring.

7. An organic electroluminescence device according to claim 1, wherein the phosphorescent organic guest material comprises a compound represented by the following structural formula (4):

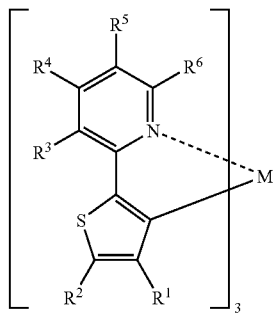

(4)

in the structural formula (4), M represents a metal, $R^1$ to $R^6$ each independently includes a hydrogen atom, alkyl group, oxy group, amino group or a hydrocarbon group having at least one carbon atom in the substituent, the number of carbon atoms is 1 to 10 in each of the hydrocarbon moieties, further, $R^1$ to $R^6$ can be selected independently from cyano, halogen, and α-haloalkyl, α-haloalkoxy, amide, sulfonyl, carbonyl, carbonyloxy and oxycarbonyl substituents containing 10 or less carbon atoms and, further, $R^1$ together with $R^2$, $R^3$ together with $R^4$, $R^4$ together with $R^5$, or $R^5$ together with $R^6$ can form a condensed benzo ring.

8. An organic electroluminescence device according to claim 7, wherein M in the phosphorescent organic guest material is iridium.

9. An organic electroluminescence device according to claim 1, wherein the phosphorescent organic guest material comprises a compound represented by the following structural formula (5):

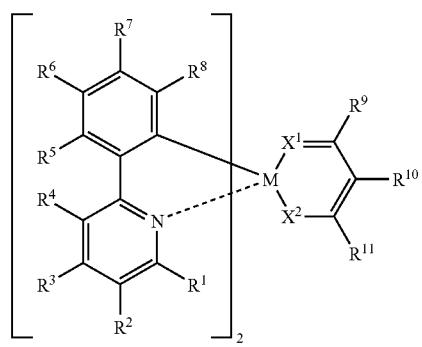

(5)

in the structural formula (5), M represents iridium, $X^1$ and $X^2$ each independently represents an oxygen atom or a sulfur atom, $R^1$ to $R^{11}$ each independently includes a hydrogen atom, alkyl group, oxy group, amino group, or a hydrocarbon group having at least one carbon atom in the substituent, the number of carbon atoms is 1 to 10 in each of the hydrocarbon moieties, further, $R^1$ to $R^{11}$ can be selected independently from cyano, halogen, and α-haloalkyl, α-haloalkoxy, amide, sulfonyl, carbonyl, carbonyloxy and oxycarbonyl substituents containing 10 or less carbon atoms and, further, $R^1$ together with $R^2$, $R^2$ together with $R^3$, $R^3$ together with $R^4$, $R^4$ together with $R^5$, $R^5$ together with $R^6$, $R^6$ together with $R^7$, or $R^7$ together with $R^8$ can form a condensed benzo ring.

10. An organic electroluminescence device according to claim 1, wherein the phosphorescent organic guest material comprises a compound represented by the following structural formula (6):

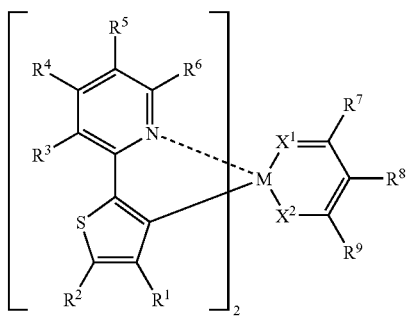

(6)

in the structural formula (6), M represents iridium, $X^1$ and $X^2$ each independently represents an oxygen atom or a sulfur atom, $R^1$ to $R^9$ each independently includes a hydrogen atom, alkyl group, oxy group, amino group or a hydrocarbon group having at least one carbon atom in the substituent, the number of carbon atoms is 1 to 10 in each of the hydrocarbon moieties, further, $R^1$ to $R^9$ can be selected independently from cyano, halogen, and α-haloalkyl, α-haloalkoxy, amide, sulfonyl, carbonyl, carbonyloxy and oxycarbonyl substituents containing 10 or less of carbon atoms and, further, $R^1$ together with $R^2$, $R^3$ together with $R^4$, $R^4$ together with $R^5$, $R^5$ together with $R^6$, $R^7$ together with $R^8$, or $R^8$ together with $R^9$ can form a condensed benzo ring.

* * * * *